(12) United States Patent
Bailey

(10) Patent No.: US 9,680,450 B2
(45) Date of Patent: Jun. 13, 2017

(54) FLIP-FLOP CIRCUIT WITH LATCH BYPASS

(71) Applicant: Advanced Micro Devices, Inc., Sunnyvale, CA (US)

(72) Inventor: Daniel W. Bailey, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/625,849

(22) Filed: Feb. 19, 2015

(65) Prior Publication Data

US 2016/0248405 A1 Aug. 25, 2016

(51) Int. Cl.
*H03K 3/00* (2006.01)
*H03K 3/037* (2006.01)
*H03K 3/356* (2006.01)
*H03K 3/3562* (2006.01)

(52) U.S. Cl.
CPC ....... *H03K 3/0372* (2013.01); *H03K 3/35625* (2013.01); *H03K 3/356139* (2013.01); *H03K 3/356173* (2013.01)

(58) Field of Classification Search
None
See application file for complete search history.

(56) References Cited

U.S. PATENT DOCUMENTS

| | | | | |
|---|---|---|---|---|
| 6,781,411 B2* | 8/2004 | Steiss | ..................... | H03K 3/012 327/202 |
| 7,301,372 B2* | 11/2007 | Anderson | ...... | G01R 31/318541 326/16 |
| 7,301,373 B1 | 11/2007 | Bailey et al. | | |
| 7,353,441 B2* | 4/2008 | Hirano | ........... | G01R 31/318541 714/726 |
| 8,072,252 B2 | 12/2011 | Bailey et al. | | |

* cited by examiner

*Primary Examiner* — Long Nguyen
(74) *Attorney, Agent, or Firm* — Polansky & Associates, P.L.L.C.; Paul J. Polansky

(57) ABSTRACT

In one form, a flip-flop comprises a master latch, a slave latch, and a multiplexer. The master latch has an input for receiving a data input signal, and an output, and operates in transparent and latching modes during respective first and second phases of a clock signal. The slave latch has an input coupled to the output of the master latch, and an output, and operates in the transparent and latching modes during the second and first phases of the clock signal, respectively. The multiplexer has a first input coupled to the output of the slave latch, a second input coupled to the output of the master latch, and an output for providing a data output signal, and provides the first input to the output during the first phase of the clock signal, and the second input to the output during the second phase of the clock signal.

11 Claims, 5 Drawing Sheets

FLIP-FLOP CIRCUIT WITH LATCH BYPASS

FIELD

This disclosure relates generally to digital logic circuits, and more specifically to high-speed flip-flop circuits.

BACKGROUND

Flip-flops are used as building blocks in a variety of sequential logic circuits such as registers. For example, many modern microprocessors use a technique known as pipelining in which the processing of an instruction is broken down into several smaller sub-tasks, each of which can be performed within one clock cycle. Pipelined microprocessors include dedicated circuitry to perform each sub-task, and different instructions are processed at each subtask in a sequential, or pipelined fashion. By using this technique, pipelined microprocessors are able to achieve high effective instruction throughput even though only a portion of any individual instruction is processed per clock cycle in one of the pipeline stages.

Pipelined microprocessors use pipeline registers to store the results of an operation at a particular pipeline stage and provide these results to a subsequent pipeline stage. The speed of a pipelined microprocessor is limited by the amount of time it takes to perform the functions of a pipeline stage as well as to store the results stably in the pipeline register. Thus the speed in which the microprocessor clock can be set at is limited, in part, by the delay through the pipeline register, and hence the flip-flops that make up the pipeline register.

Figure 1:
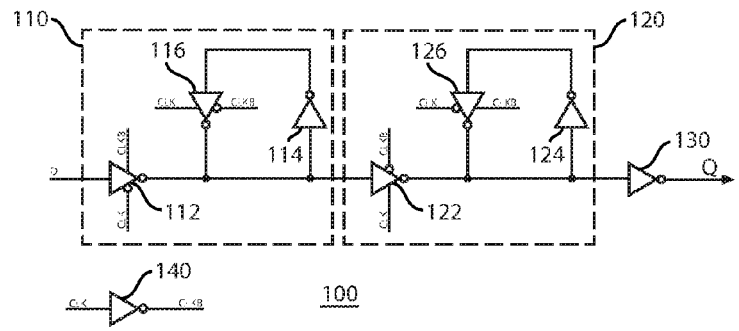
FIG. 1 illustrates in logic diagram form a master-slave flip-flop known in the prior art.

In the following description, the use of the same reference numerals in different drawings indicates similar or identical items. Unless otherwise noted, the word "coupled" and its associated verb forms include both direct connection and indirect connection by means known in the art, and unless otherwise noted any description of direct connection implies alternate embodiments using suitable forms of indirect connection as well.

DETAILED DESCRIPTION OF ILLUSTRATIVE EMBODIMENTS

According to various embodiments disclosed below, a flip-flop includes a latch bypass feature to decrease delay time from input to output, making it suitable for higher-speed operation. In one form, a flip-flop includes a master latch, a slave latch, and a multiplexer. The master latch has an input for receiving a data input signal, and an output, and operates in a transparent mode during a first phase of a clock signal and a latching mode during a second phase of the clock signal. The slave latch has an input connected to the output of the master latch, and an output, and operates in the transparent mode during the second phase of the clock signal and the latching mode during the first phase of the clock signal. The multiplexer has a first input connected to the output of the slave latch, a second input connected to the output of the master latch, and an output for providing a data output signal, and provides the first input to the output during the first phase of the clock signal, and the second input to the output during the second phase of the clock signal.

In another form, a flip-flop includes a differential circuit, a latch circuit, and a multiplexer. The differential circuit has an input for receiving a first data input signal, and an output, and operates in a precharge mode during a first phase of a clock signal and an evaluation mode during a second phase of the clock signal. The latch circuit has an input connected to the output of the differential circuit, and an output, and operates in a latching mode during the first phase of the clock signal and in a transparent mode during the second phase of the clock signal. The multiplexer has a first input connected to the output of the differential circuit, a second input connected to the output of the latch circuit, and an output for providing a data output signal, and provides the second input to the output during the first phase of the clock signal and the first input to the output during the second phase of the clock signal.

In yet another form, a microprocessor includes a first functional circuit having an output, a second functional circuit having an input, and a scan chain disposed between the output of the first functional circuit and the input of the second functional circuit. The scan chain captures the output of the first functional circuit and provides the output, so captured, to the input of the second functional circuit in a functional mode, and scans scan data into the scan chain and provides the scan data, so scanned, to the input of the second functional circuit in a scan mode. The scan chain includes a plurality of scan flip-flops with latch bypass, each for storing a data input signal and providing the data input signal, so stored, as a data output signal in response to transitions of a clock signal in the functional mode, and for storing a scan data input signal and providing the scan data input signal, so stored, as the data output signal in response to transitions of the clock signal in the scan mode.

FIG. 1 illustrates in logic diagram form a master-slave flip-flop 100 known in the prior art. Master-slave flip-flop 100 includes generally a master latch 110, a slave latch 120, an output inverter 130, and a clock inverter 140.

Master latch 110 has an input for receiving a data input signal labeled "D", and an output, and includes a three-state inverter 112, an inverter 114, and a three-state inverter 116. Three-state inverter 112 has an input for receiving data input signal D, an output, a true control input for receiving a complementary clock signal labeled "CLKB", and a complementary control input for receiving a true clock signal labeled "CLK". A three-state inverter in an inverter having three output states: a logic high state, a logic low state, and a high impedance state (also known as a floating or undriven state). A three state inverter goes into the high-impedance state when its true control input is high and its complementary control input is low. Inverter 114 has an input connected to the output of three-state inverter 112, and an output. Three-state inverter 116 has an input connected to the output of three-state inverter 114, an output connected to the input of inverter 114, a true control input for receiving true clock signal CLK, and a complementary control input for receiving complementary clock signal CLKB.

Slave latch 120 has an input connected to the output of master latch 110, and an output, and includes a three-state inverter 122, an inverter 124, and a three-state inverter 126. Three-state inverter 122 is a three-state inverter having an input connected to the output of master latch 110, an output, a true control input for receiving true clock signal CLK, and a complementary control input for receiving a complementary clock signal CLKB. Inverter 124 has an input connected to the output of three-state inverter 122, and an output. Three-state inverter 126 is a three-state inverter having an input connected to the output of inverter 124, an output connected to the input of inverter 124, a true control input for receiving complementary clock signal CLKB, and a complementary control input for receiving true clock signal CLK.

Output inverter 130 has an input connected to the output of slave latch 120, and an output for providing a signal labeled "Q". Clock inverter 140 has an input for receiving true clock signal CLK, and an output for providing complementary clock signal CLKB.

In operation, when true clock signal CLK is low, slave latch 120 blocks data from master latch 110 because three-state inverter 122 is disabled, and inverter 126 is active. As true clock signal CLK rises, slave latch 120 becomes transparent as three-state inverter 122 becomes enabled, while at the same time master latch 110 latches and blocks data input signal D with inverter 112 disabled. The nominal delay from D to Q is the setup time for data input signal D before the rising edge of true clock signal CLK plus three gate delays through three-state inverter 112, three-state inverter 122, and output inverter 130. This delay becomes the critical timing path through master-slave flip-flop 100 and limits the clock speed of an integrated circuit using it in the worst-case timing paths.

Figure 2:
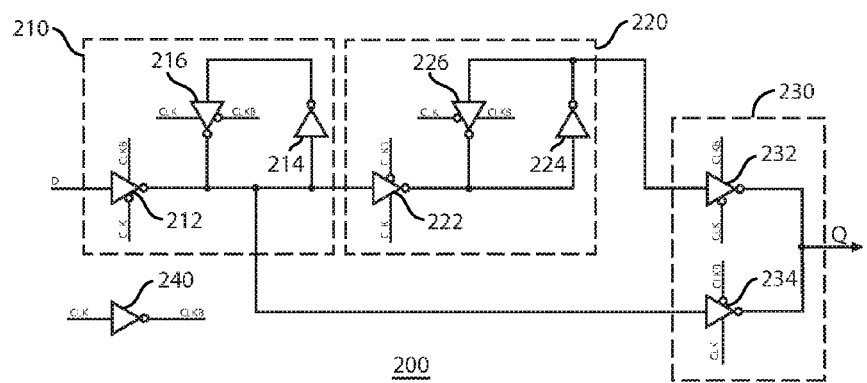
FIG. 2 illustrates in logic diagram form a master-slave flip-flop with latch bypass according to some embodiments.

FIG. 2 illustrates in logic diagram form a master-slave flip-flop 200 with latch bypass according to some embodiments. Master-slave flip-flop 200 includes generally a master latch 210, a slave latch 220, a multiplexer 230, and a clock inverter 240.

Master latch 210 has an input for receiving a data input signal D, and an output, and includes a three-state inverter 212, an inverter 214, and a three-state inverter 216. Three-state inverter 212 is a three-state inverter having an input for receiving data input signal D, an output, a true control input for receiving complementary clock signal CLKB, and a complementary control input for receiving true clock signal CLK. Inverter 214 has an input connected to the output of three-state inverter 212, and an output. Three-state inverter 216 is a three-state inverter having an input connected to the output of inverter 214, an output connected to the input of inverter 214, a true control input for receiving true clock signal CLK, and a complementary control input for receiving complementary clock signal CLKB.

Slave latch 220 has an input connected to the output of master latch 210, and an output, and includes a three-state inverter 222, an inverter 224, and a three-state inverter 226. Three-state inverter 222 is a three-state inverter having an input connected to the output of master latch 210, an output for providing the output of slave latch 220, a true control input for receiving true clock signal CLK, and a complementary control input for receiving a complementary clock signal CLKB. Inverter 224 has an input connected to the output of three-state inverter 222, and an output. Three-state inverter 226 is a three-state inverter having an input connected to the output of inverter 224, an output connected to the input of inverter 224, a true control input for receiving complementary clock signal CLKB, and a complementary control input for receiving true clock signal CLK.

Multiplexer 230 has a first input connected to the output of slave latch 220, a second input connected to the output of master latch 210, and an output for providing an output signal labeled "Q". Multiplexer 230 includes three-state inverters 232 and 234. Three-state inverter 232 is a three-state inverter having an input connected to the output of slave latch 220, an output for providing output signal Q, a true control input for receiving complementary clock signal CLKB, and a complementary control input for receiving true clock signal CLK. Three-state inverter 234 is a three-state inverter having an input connected to the output of master latch 210, an output connected to the output of three-state inverter 232, a true control input for receiving complementary clock signal CLKB, and a complementary control input for receiving true clock signal CLK.

Clock inverter 240 has an input for receiving true clock signal CLK, and an output for providing complementary clock signal CLKB.

In operation, inverters 232 and 234 form a multiplexer used to output signal Q. As true clock signal CLK rises, master latch 210 latches data input signal D and drives Q through three-state inverter 234, which is also enabled. It also drives the input of slave latch 220, but the input of slave latch 220 is blocked by three-state inverter 222. As true clock signal CLK falls, slave latch 220 latches, and three-state inverter 232 becomes enabled as three-state inverter 234 becomes disabled. Output signal Q does not change on the falling edge of true clock signal CLK but three-state inverter 232 continues to output the logic state previously output by three-state inverter 234. The delay from data input signal D to output signal Q is the setup time of D before the rising edge of true clock signal CLK, plus only two gate delays through three-state inverter 212 and three-state inverter 234 in multiplexer 230. Thus flip-flop 200 shortens the delay compared to flip-flop 100 and increases the possible clock speed of the integrated circuit using it according to this delay.

Figure 3:
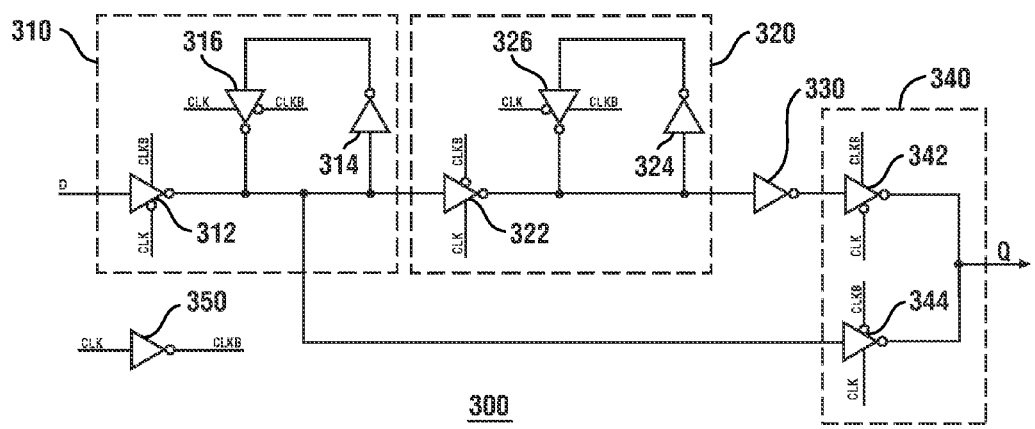
FIG. 3 illustrates in logic diagram form another master-slave flip-flop with latch bypass according to some embodiments.

FIG. 3 illustrates in logic diagram form another master-slave flip-flop with latch bypass according to some embodiments. Master-slave flip-flop 300 includes generally a master latch 310, a slave latch 320, an output inverter 330, a multiplexer 340, and a clock inverter 350.

Master latch 310 has an input for receiving a data signal labeled "D", and an output, and includes a three-state inverter 312, an inverter 314, and a three-state inverter 316. Three-state inverter 312 is a three-state inverter having an input for receiving data input signal D, an output, a true control input for receiving complementary clock signal CLKB, and a complementary control input for receiving true clock signal CLK. Inverter 314 has an input connected to the output of three-state inverter 312, and an output. Three-state inverter 316 is a three-state inverter having an input connected to the output of inverter 314, an output connected to the input of inverter 314, a true control input for receiving true clock signal CLK, and a complementary control input for receiving complementary clock signal CLKB.

Slave latch 320 has an input connected to the output of master latch 310, and an output, and includes a three-state inverter 322, an inverter 324, and a three-state inverter 326. Three-state inverter 322 is a three-state inverter having an input connected to the output of master latch 310, an output, a true control input for receiving true clock signal CLK, and a complementary control input for receiving a complementary clock signal CLKB. Inverter 324 has an input connected to the output of three-state inverter 322, and an output. Inverter 326 is a three-state inverter having an input connected to the output of inverter 324, an output connected to the input of inverter 324, a true control input for receiving complementary clock signal CLKB, and a complementary control input for receiving true clock signal CLK.

Output inverter 330 has an input connected to the output of slave latch 320, and an output.

Multiplexer 340 has a first input connected to the output of output inverter 330, a second input connected to the output of master latch 310, and an output for providing output signal Q. Multiplexer 340 includes three-state inverters 342 and 344. Three-state inverter 342 is a three-state inverter having an input connected to the output of output inverter 330, an output for providing output signal Q, a true control input for receiving complementary clock signal CLKB, and a complementary control input for receiving true clock signal CLK. Inverter 344 is a three-state inverter having an input connected to the output of master latch 310, an output connected to the output of three-state inverter 342, a true control input for receiving complementary clock signal CLKB, and a complementary control input for receiving true clock signal CLK.

Clock inverter 350 has an input for receiving true clock signal CLK, and an output for providing complementary clock signal CLKB.

In operation, flip-flop 300 is similar to flip-flop 200 of FIG. 2 in that it provides the same delay time, but allows multiplexer 340 to be added as a header gate to the output of a conventional flip-flop having the same structure as flip-flop 100 of FIG. 1. Unlike flip-flop 200, flip-flop 300 uses the output of three-state inverter 322 as the output of slave latch 320, and thus the output of output inverter 330 corresponds to an inverted version of data input signal D such that when true clock signal CLK is low, three-state inverter 342 provides output signal Q in the same logic state as data input signal D.

In some embodiments, the master-slave flip-flops of FIGS. 2 and 3 can be modified to add scan capability. A scan-capable version of master-slave flip-flops 200 and 300 of FIGS. 2 and 3, respectively, would include an input multiplexer to select between a data input signal from a functional circuit, and a scan data input signal from a previous flip-flop in the scan chain, during either a functional mode or a scan mode, respectively. Moreover a pipelined microprocessor having a scan chain built using scan-capable versions of the master-slave flip-flop could operate with higher clock speeds due to the lower delay time through the flip-flop due to the latch bypass feature.

Figure 4:
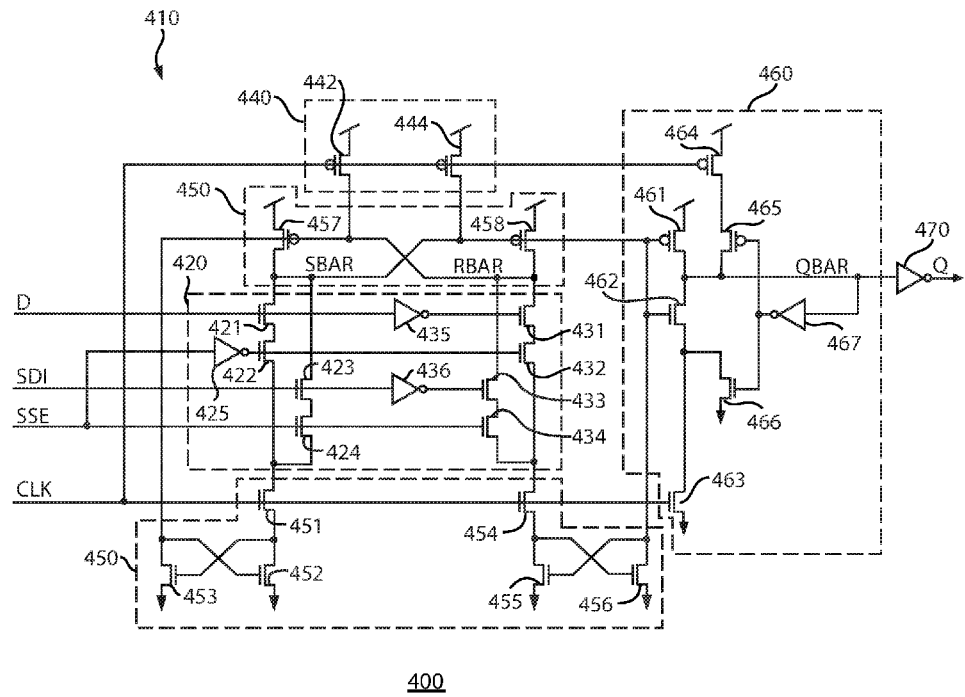
FIG. 4 illustrates in partial logic diagram and partial schematic form another type of flip-flop known in the prior art.

FIG. 4 illustrates in partial logic diagram and partial schematic form a flip-flop 400 known in the prior art. Flip-flop 400 is an asymmetric precharged flip-flop and generally includes a differential circuit 410, a latch circuit 460, and an output inverter 470. Differential circuit 410 has a data input portion 420, a precharge portion 440, and a latch portion 450.

Data input portion 420 includes an N-channel metal-oxide-semiconductor (MOS) transistors 421, 422, 423, and 424, an inverter 425, N-channel MOS transistors 431, 432, 433, and 434, and inverters 435 and 436. Transistor 421 has a drain connected to a node labeled "SBAR", a gate for receiving data input signal D, and a source. Transistor 422 has a drain connected to the source of transistor 421, a gate, and a source. Transistor 423 has a drain connected to node SBAR, a gate for receiving a scan data signal labeled "SDI", and a source. Transistor 424 has a drain connected to the source of transistor 423, a gate for receiving a scan enable signal labeled "SSE", and a source connected to the source of transistor 422. Inverter 425 has an input for receiving scan enable signal SSE, and an output connected to the gate of transistor 422. Transistor 431 has a drain connected to a node labeled "RBAR", a gate, and a source. Transistor 432 has a drain connected to the source of transistor 431, a gate connected to the output of inverter 425, and a source. Transistor 433 has a drain connected to node RBAR, a gate, and a source. Transistor 434 has a drain connected to the source of transistor 433, a gate for receiving scan enable signal SSE, and a source connected to the source of transistor 432. Inverter 435 has an input for receiving data input signal D, and an output connected to the gate of transistor 431. Inverter 436 has an input for receiving scan data input signal SDI, and an output connected to the gate of transistor 433.

Precharge portion 440 includes P-channel transistors 442 and 444. Transistor 442 has a source connected to a power supply voltage terminal, a gate for receiving true clock signal CLK, and a drain connected to node RBAR. The power supply voltage terminal is more-positive with respect to ground and has a nominal voltage of, for example, 0.9 volts. Transistor 444 has a source connected to the power supply voltage terminal, a gate for receiving true clock signal CLK, and a drain connected to node SBAR.

Latch portion 450 includes N-channel transistors 451-456, and P-channel transistors 457 and 458. Transistor 451 has a drain connected to the sources of transistors 422 and 424, a gate for receiving true clock signal CLK, and a source. Transistor 452 has a drain connected to the source of transistor 451, a gate connected to node RBAR, and a source connected to ground. Transistor 453 has a drain connected to node RBAR, a gate connected to the drain of transistor 452, and a source connected to ground. Transistor 454 has a drain connected to the sources of transistors 432 and 434, a gate for receiving true clock signal CLK, and a source. Transistor 455 has a drain connected to the source of transistor 454, a gate connected to node SBAR, and a source connected to ground. Transistor 456 has a drain connected to node SBAR, a gate connected to the drain of transistor 455, and a source connected to ground. Transistor 457 has a source connected to the power supply voltage terminal, a gate connected to node RBAR, and a drain connected to node SBAR. Transistor 458 has a source connected to the power supply voltage terminal, a gate connected to node SBAR, and a drain connected to node RBAR.

Latch circuit 460 includes a P-channel transistor 461, N-channel transistors 462 and 463, P-channel transistors 464 and 465, an N-channel transistor 466, and an inverter 467. Transistor 461 has a source connected to the power supply voltage terminal, a gate connected to node SBAR, and a drain connected to a node labeled "QBAR". Transistor 462 has a drain connected to the drain of transistor 461 at node QBAR, a gate connected to node SBAR, and a source. Transistor 463 has a drain connected to the source of transistor 462, a gate for receiving true clock signal CLK, and a source connected to ground. Transistor 464 has a source connected to the power supply voltage terminal, a gate connected for receiving the true clock signal CLK, and a drain. Transistor 465 has a source connected to the drain of transistor 464, a gate, and a drain connected to node QBAR. Transistor 466 has a drain connected to the source of transistor 462, a gate, and a source connected to ground. Inverter 467 has an input connected to the QBAR node, and an output connected to the gates of transistors 465 and 466.

Output inverter 470 has an input connected to node QBAR, and an output providing output signal Q.

In operation, flip-flop 400 is a type of flip-flop known as an asymmetric precharged flip-flop (APFF) and includes a scan capability. When scan enable signal SSE is low, flip-flop 400 is in a normal operation mode and the logic state of output signal Q is determined by the logic state of data input signal D. The high voltage on scan enable signal SSE causes the output of inverter 425 to go high, which makes transistors 422 and 432 conductive and causes the state of data input signal D to determine the logic state of output signal Q. In the normal operation mode, when true clock signal CLK is low, transistors 442 and 444 are conductive and precharge nodes RBAR and SBAR high, respectively. If data input signal D is high, then as true clock signal CLK rises, SBAR falls, which causes RBAR to rise. Latch portion 450 amplifies and latches the differential voltage between RBAR and SBAR, resulting in a stable logic low voltage on signal SBAR. The logic low voltage on SBAR in turn causes latch circuit 460 and output inverter 470 to drive output signal Q low. If on the other hand data input signal D is low, then as true clock signal CLK rises, RBAR falls, which causes SBAR to rise. Latch portion 450 amplifies and latches the differential voltage between SBAR and RBAR, resulting in a stable logic high voltage on signal SBAR. The logic high voltage on SBAR in turn causes latch circuit 460 and output inverter 470 to drive output signal Q high.

When scan enable signal SSE is high, flip-flop 400 is in a scan mode and the logic state of output signal Q is determined by the logic state of scan data input signal SDI. In the scan mode, when true clock signal CLK is low, transistors 442 and 444 are conductive and precharge nodes RBAR and SBAR high, respectively. If scan data input signal SDI is high, then as true clock signal CLK rises, SBAR falls, which holds RBAR high by making transistor 458 conductive. Latch portion 450 amplifies and latches the differential voltage between RBAR and SBAR, resulting in a stable logic low voltage on signal SBAR. The logic low voltage on SBAR in turn causes latch circuit 460 and output inverter 470 to drive output signal Q low. If on the other hand scan data input signal SDI is low, then as true clock signal CLK rises, RBAR falls, which holds SBAR high by making transistor 457 conductive. Latch portion 450 amplifies and latches the differential voltage between SBAR and RBAR, resulting in a stable logic high voltage on signal SBAR. The logic high voltage on SBAR in turn causes latch circuit 460 and output inverter 470 to drive output signal Q high.

In this manner, scan enable signal SSE selects a mode of operation and a corresponding input signal, and the rising edge of true clock signal CLK causes differential circuit 410 to quickly latch a differential voltage between SBAR and RBAR. Moreover latch circuit 460 includes its own latching mechanism using inverter 467 to reinforce the logic state developed on QBAR. Latch circuit 460 is blocking when true clock signal CLK is low, and transparent when true clock signal CLK is high.

However when true clock signal CLK is low, transistors 452 and 453 are discharged low. When true clock signal CLK rises and the selected data signal is high, then the delay through differential circuit 410 of flip-flop 400 requires three nominal gate delays as node SBAR is discharged from a precharged high state through transistors 421, 422, 451, and 452. Only when the logic high voltage on SBAR is suitably discharged does transistor 461 become conductive enough to charge QBAR high, which in turn will discharge output signal Q low. On the other hand when true clock signal CLK rises and the selected data signal is low, then the delay through differential circuit 410 of flip-flop 400 requires two nominal gate delays as node SBAR is kept charged. When true clock signal CLK transitions high, QBAR will be discharged through transistors 462 and 463, and output signal Q will be charged to a logic high state. From a precharged high state through transistors 421, 422, 451, and 452. Only when the logic high voltage on SBAR is suitably discharged does transistor 458 become conductive to reinforce the logic high on RBAR.

Since the delay may be as many as three nominal gate delays, the frequency of the clock signal driving the circuits in which flip-flop 400 is used is limited by the setup time of data input signal D (or scan data input signal SDI) before the rising edge of true clock signal CLK plus three nominal gate delays.

Figure 5:
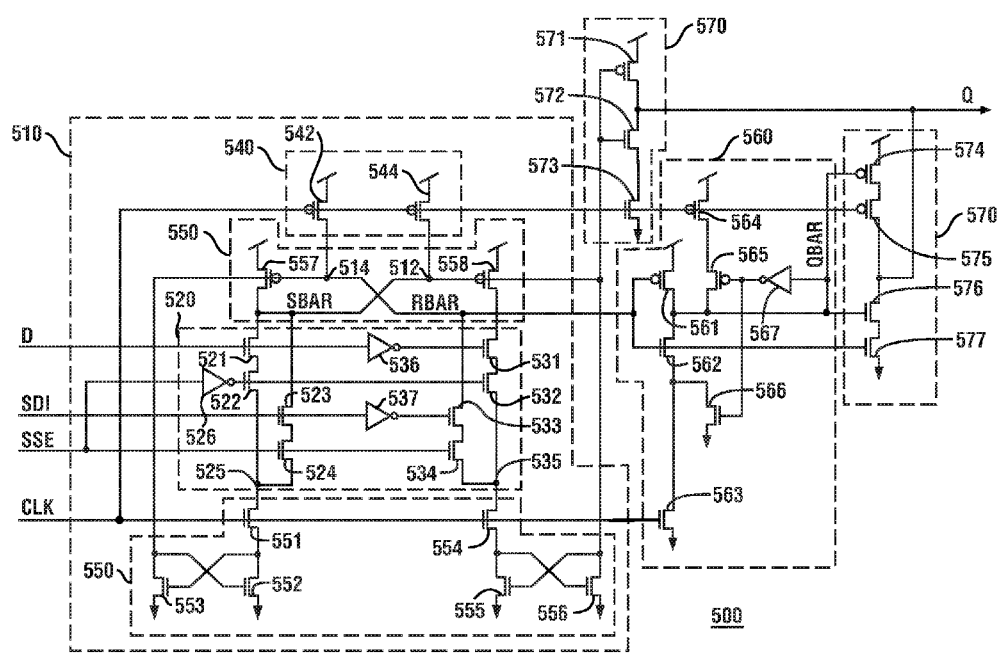
FIG. 5 illustrates in partial logic diagram and partial schematic form a flip-flop of the same type as the flip-flop of FIG. 4 with latch bypass according to some embodiments.

FIG. 5 illustrates in partial logic diagram and partial schematic form a flip-flop of the same type as flip-flop 400 of FIG. 4 with latch bypass according to some embodiments. Flip-flop 500 is an asymmetric precharged flip-flop with latch bypass having a differential circuit 510, a latch circuit 560, and a multiplexer 570. Differential circuit 510 includes a data input portion 520, a precharge portion 540, and a latch portion 550. Data input portion 520 includes an N-channel metal-oxide-semiconductor (MOS) transistors 521, 522, 523, and 524, an inverter 526, N-channel MOS transistors 531, 532, 533, and 534, and inverters 536 and 537. Transistor 521 has a drain connected to a node labeled "SBAR", a gate for receiving data input signal D, and a source. Transistor 522 has a drain connected to the source of transistor 521, a gate, and a source connected to a sense node 525. Transistor 523 has a drain connected to node SBAR, a gate for receiving a scan data signal labeled "SDI", and a source. Transistor 524 has a drain connected to the source of transistor 523, a gate for receiving a scan enable signal labeled "SSE", and a source connected to sense node 525. Inverter 526 has an input for receiving scan enable signal SSE, and an output connected to the gate of transistor 522. Transistor 531 has a drain connected to a node labeled "RBAR", a gate and a source. Transistor 532 has a drain connected to the source of transistor 531, a gate connected to the output of inverter 526, and a source connected to a sense node 535. Transistor 533 has a drain connected to node RBAR, a gate, and a source. Transistor 534 has a drain connected to the source of transistor 533, a gate for receiving scan enable signal SSE, and a source connected to sense node 535. Inverter 536 has an input for receiving data input signal D, and an output connected to the gate of transistor 531. Inverter 537 has an input for receiving scan data input signal SDI, and an output connected to the gate of transistor 533.

Precharge portion 540 includes P-channel transistors 542 and 544. Transistor 542 has a source connected to a power supply voltage terminal, a gate for receiving true clock signal CLK, and a drain connected to node RBAR. The power supply voltage terminal is more-positive with respect to ground as has a nominal voltage of, for example, 0.9 volts. Transistor 544 has a source connected to the power supply voltage terminal, a gate for receiving true clock signal CLK, and a drain connected to node SBAR.

Latch portion 550 includes N-channel transistors 551-556, and P-channel transistors 557 and 558. Transistor 551 has a drain connected to the sources of transistors 522 and 524, a gate for receiving true clock signal CLK, and a source. Transistor 552 has a drain connected to the source of transistor 551, a gate connected to node RBAR, and a source connected to ground. Transistor 553 has a drain connected to node RBAR, a gate connected to the drain of transistor 552, and a source connected to ground. Transistor 554 has a drain connected to the sources of transistors 532 and 534, a gate for receiving true clock signal CLK, and a source. Transistor 555 has a drain connected to the source of transistor 554, a gate connected to node SBAR, and a source connected to ground. Transistor 556 has a drain connected to node SBAR, a gate connected to the drain of transistor 555, and a source connected to ground. Transistor 557 has a source connected to the power supply voltage terminal, a gate connected to node RBAR, and a drain connected to node SBAR. Transistor 558 has a source connected to the power supply voltage terminal, a gate connected to node SBAR, and a drain connected to node RBAR.

Latch circuit 560 includes a P-channel transistor 561, N-channel transistors 562 and 563, P-channel transistors 564 and 565, an N-channel transistor 566, and an inverter 567. Transistor 561 has a source connected to the power supply voltage terminal, a gate connected to node RBAR, and a drain connected to a node labeled "QBAR". Transistor 562 has a drain connected to the drain of transistor 561 at node QBAR, a gate connected to node SBAR, and a source. Transistor 563 has a drain connected to the source of transistor 562, a gate for receiving true clock signal CLK, and a source connected to ground. Transistor 564 has a source connected to the power supply voltage terminal, a gate for receiving the true clock signal CLK, and a drain. Transistor 565 has a source connected to the drain of transistor 564, a gate, and a source connected to node QBAR. Transistor 566 has a drain connected to the source of transistor 562, a gate, and a source connected to ground. Inverter 567 has an input connected to the QBAR node, and an output connected to the gates of transistors 565 and 566.

Multiplexer 570 includes a P-channel transistor 571, N-channel transistors 572 and 573, a P-channel transistors 574 and 575, and N-channel transistors 576 and 577. Transistor 571 has a source connected to the power supply voltage terminal, a gate connected to SBAR, and a drain for providing output signal Q. Transistor 572 has a drain connected to the drain of transistor 571, a gate connected to SBAR, and a source. Transistor 573 has a drain connected to the source of transistor 572, a gate for receiving true clock signal CLK, and a source connected to ground. Transistor 574 has a source connected to the power supply voltage terminal, a gate connected to QBAR, and a drain. Transistor 575 has a source connected to the drain of transistor 574, a gate for receiving true clock signal CLK, and a drain connected to the drain of transistor 571. Transistor 576 has a drain connected to the drain of transistor 575, a gate connected to QBAR, and a source. Transistor 577 has a drain connected to the source of transistor 576, a gate connected to RBAR, and a source connected to ground.

In operation, flip-flop 500 is an asymmetric precharged flip-flop (APFF) with a scan capability and latch bypass. Differential circuit 510 and latch circuit 560 operate substantially the same as differential circuit 410 and latch circuit 460, respectively, of flip-flop 400 of FIG. 4. However flip-flop 500 uses a multiplexer 570 in place of output inverter 470 of flip-flop 400 to achieve shorter delay and hence higher speed operation.

As in flip-flop 400, scan enable signal SSE determines which data signal is captured. If scan enable signal SSE is low, flip-flop 500 is in a normal operation mode and data input signal D is captured. If on the other hand scan enable signal SSE is high, flip-flop 500 is in a scan mode and scan data input signal SDI is captured. If the selected data signal is high (e.g. D in normal operation mode or SDI in scan mode), then as true clock signal CLK rises, SBAR falls, which causes RBAR to rise. Latching portion 550 amplifies and latches the differential voltage between RBAR and SBAR, resulting in a stable logic low voltage on signal SBAR. The logic low voltage on SBAR in turn causes transistor 571 to be active and to drive output signal Q high. If the selected data signal is low, then as true clock signal CLK rises, RBAR falls, which causes SBAR to rise. Latch circuit 560 amplifies and latches the differential voltage between SBAR and RBAR, resulting in a stable logic high voltage on SBAR. The logic high voltage on SBAR in turn causes transistor 572 to be conductive, and since transistor 573 was made conductive by the rising edge of true clock signal CLK, multiplexer 570 provides output signal Q at a logic low.

When true clock signal CLK is low, transistor 575 becomes conductive, and transistors 574 and 576 are conductive or not based on the logic state of QBAR. Thus when true clock signal CLK is low, multiplexer 570 selects the output of latch circuit 560 to provide and maintain the value of output signal Q.

However when true clock signal CLK is low, a latch formed by transistors 552 and 553 and a latch formed by transistors 555 and 556 are pre-discharged low. When true clock signal CLK rises and the selected data signal is high, then the delay through the input portion of flip-flop 500 requires only two transistor switching delays as node SBAR is discharged from a precharged high state through transistors 521 and 552. Likewise, when true clock signal CLK rises and the selected data signal is low, then the delay through the input portion of flip-flop 500 requires two transistor switching delays as node RBAR is discharged from a precharged high state through transistors 554 and 553, which makes transistor 557 conductive, increasing SBAR and driving output signal Q low.

Thus the delay through flip-flop 500 is equal to the setup time of data input signal D (or scan data input signal SDI) before the rising edge of true clock signal CLK plus two nominal gate delays. This delay time is shorter than the delay time through flip-flop 400 of FIG. 4 and allows higher clock frequencies to be used.

Figure 6:
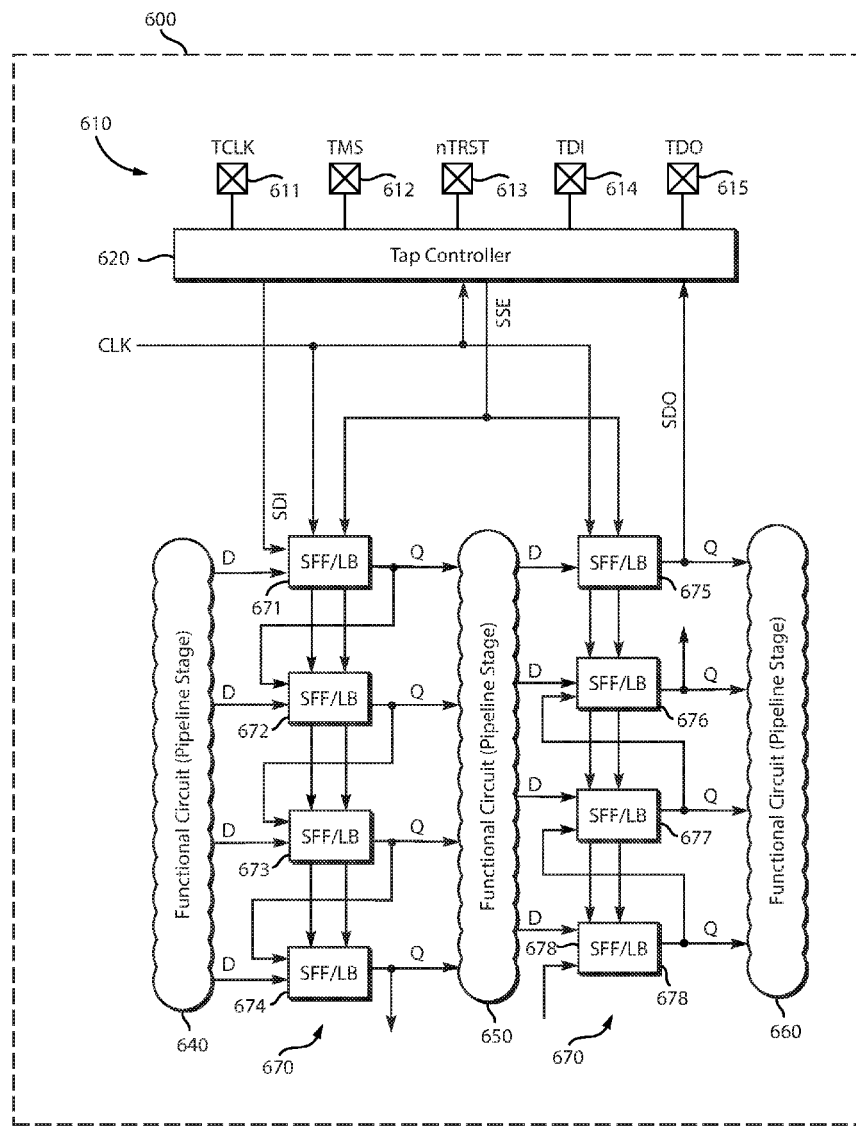
FIG. 6 illustrates in block diagram form a pipelined microprocessor with a scan chain using scan flip-flops with latch bypass according to some embodiments.

FIG. 6 illustrates in block diagram form a pipelined microprocessor 600 with a scan chain 670 using scan flip-flops according to some embodiments. FIG. 6 shows features of pipelined microprocessor 600 related to the use of scan flip flops with latch bypass but does not show other features. These other features include conventional microprocessor features that are well-known to those of ordinary skill in the art. Pipelined microprocessor 600 is a single chip data processor that can implement any of a number of known processor types such a reduced instruction set computer (RISC), a complex instruction set computer (CISC), a graphics processing unit (GPU), a digital signal processor (DSP), a network processor, and the like. Pipelined microprocessor 600 includes generally a set of scan terminals 610, a test access port (TAP) controller 620, functional circuits 640, 650, and 660, and scan chain 670.

Scan terminals 610 are implemented as bonding pads used for communicating various signals related to the operation of TAP controller 620. Scan terminals 610 include an input terminal 611 for receiving an external test clock signal labeled "TCLK", an input terminal 612 for receiving a test mode select signal labeled "TMS", an input terminal 613 for receiving an active low test reset signal labeled "nTRST", an input terminal 614 for receiving test data input signal TDI, and an output terminal 615 for providing a test data output signal labeled "TDO". In some embodiments such as that shown in FIG. 6, TAP controller 620 can have an interface compatible with the Joint Test Action Group (JTAG) standard, IEEE 1149.1.

TAP controller 620 has inputs or outputs connected to corresponding ones of scan terminals 610, an input for receiving true clock signal CLK, an input for receiving a scan data output signal labeled "SDO", an output for providing the scan shift enable signal SSE, and an output for providing scan data input signal SDI.

Functional circuit 640 has a set of inputs (not shown in FIG. 6), and a set of outputs for providing a set of data signals, all labeled generically as "D". Functional circuit 650 has inputs for receiving respective data output signals, all labeled generically as "Q", and outputs for providing respective data output signals. Functional circuit 660 has inputs for receiving respective data output signals Q, and a set of outputs (not shown in FIG. 6). In the illustrated embodiment, each of functional circuits 640, 650, and 660 correspond to a pipeline stage in pipelined microprocessor 600. For example, pipelined microprocessor 600 can be a single scalar microprocessor and functional circuits 640, 650, and 660 can function as decode, dispatch, and execute stages of the pipeline, respectively. In another example, pipelined microprocessor 600 can be a super scalar microprocessor and functional circuits 640, 650, and 660 can be pipeline stages of a functional unit such as a floating point unit (FPU) that is separate from other functional units.

Scan chain 670 is formed with a set of scan flip-flops with latch bypass labeled "SFF/LB" in which the data output signal Q of one SFF/LB is received at the scan data input SDI of a subsequent SFF/LB, and all SFF/LBs receive the scan enable signal SSE and true clock signal CLK. As shown in FIG. 6, scan chain 670 includes a first set of SFF/LBs including representative SFF/LBs 671, 672, 673, and 674 connected between functional circuit 640 and functional circuit 650, and with a scan path connected in series with one another as described above, as well as a second set of SFF/LBs including representative SFF/LBs 675, 676, 677, and 678 connected between functional circuit 650 and functional circuit 660, and with a scan path connected in series with one another as described above. The data output signal Q of SFF/LB 675 forms signal SDO at the output of scan chain 670. Each SFF/LB can be implemented with any one of the DCFFs illustrated in FIGS. 2, 3, and 5 above.

The circuits of FIGS. 2, 3, 5, and 6 or portions thereof may be described or represented by a computer accessible data structure in the form of a database or other data structure which can be read by a program and used, directly or indirectly, to fabricate integrated circuits with the circuits of FIGS. 2, 3, 5, and 6. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits with the circuits of FIGS. 2, 3, 5, and 6. The netlist may then be placed and routed to produce a data set describing geometric shapes to be applied to masks. The masks may then be used in various semiconductor fabrication steps to produce integrated circuits of FIGS. 2, 3, 5, and 6. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, a master-slave flip-flop with latch bypass can be implemented by adding an output multiplexer to an existing, conventional master-slave flip-flop cell, or it can be redesigned with fewer inverters. Moreover the master-slave flip-flop or the asymmetric precharged flip-flop can incorporate a scan feature in the embodiments disclosed above, or in other embodiments can omit the scan feature. Moreover various forms of master and slave flip-flops, differential circuits and latch circuits for asymmetric precharged flip-flops, and output multiplexers may be used. In addition the flip-flops with reset bypass can be used in a variety of sequential logic circuits and in a variety of locations, such as pipeline latches of microprocessors.

Accordingly, it is intended by the appended claims to cover all modifications of the disclosed embodiments that fall within the scope of the disclosed embodiments.

What is claimed is:

1. A microprocessor comprising:
a first functional circuit having an output;
a second functional circuit having an input; and
a scan chain disposed between said output of said first functional circuit and said input of said second functional circuit, wherein said scan chain captures said output of said first functional circuit and provides said output, so captured, to said input of said second functional circuit in a functional mode, and scans scan data into said scan chain and provides said scan data, so scanned, to said input of said second functional circuit in a scan mode,
wherein said scan chain comprises:
a plurality of scan flip-flops with latch bypass for storing a data input signal and providing said data input signal, so stored, as a data output signal in response to transitions of a clock signal in said functional mode, and for storing a scan data input signal and providing said scan data input signal, so stored, as said data output signal in response to transitions of said clock signal in said scan mode.

2. The microprocessor of claim 1, wherein each of said plurality of scan flip-flops with latch bypass comprises:
a differential circuit having an input for receiving a first data input signal, and an output, and operating in a precharge mode during a first phase of said clock signal and an evaluation mode during a second phase of said clock signal;
a latch circuit having an input coupled to said output of said different circuit, and an output, and operating in a latching mode during said first phase of said clock signal and in a transparent mode during said second phase of said dock signal; and
a multiplexer having a first input coupled to said output of said differential circuit, a second input coupled to said output of said latch circuit, and an output for providing said data output signal, for providing said second input to said output during said first phase of said clock signal and said first input to said output during said second phase of said clock signal.

3. The microprocessor of claim 1, further comprising:
a test access port controller for providing said scan data input signal to a first scan flip-flop with latch bypass during said scan mode.

4. The microprocessor of claim 1, wherein each scan flip-flop with latch bypass comprises:

a master latch having an input for receiving a data input signal, and an output, and operating in a transparent mode during a first phase of a clock signal and a latching mode during a second phase of said clock signal; and a slave latch having an input coupled to said output of said master latch, and an output, and operating in said transparent mode during said second phase of said clock signal and said latching mode during said first phase of said clock signal; and a multiplexer having a first input coupled to said output of said slave latch, a second input coupled to said output of said master latch, and an output for providing a data output signal, for providing said first input to said output during said first phase of said clock signal, and said second input to said output during said second phase of said clock signal.

5. The microprocessor of claim 4 wherein said master latch comprises:

a first inverter having an input for receiving said data input signal, an output for providing said output of said master latch, a true control input for receiving a complement of said clock signal, and a complementary control input for receiving said clock signal;

a second inverter having an input coupled to said output of said first inverter, and an output; and a third inverter having an input coupled to said output of said second inverter, an output coupled to said input of said second inverter, a true control input for receiving said clock signal, and a complementary input for receiving said complement of said clock signal.

6. The microprocessor of claim 5 wherein said slave latch comprises:

a first inverter having an input coupled to said output of said master latch, an output for providing said output of said slave latch, a true control input for receiving said clock signal, and a complementary control input for receiving said complement of said clock signal; and a second inverter having an input coupled to said output of said first inverter, and an output for providing said output of said slave latch; and a third inverter having an input coupled to said output of said second inverter, an output coupled to said input of said second inverter, a true control input for receiving said complement of said clock signal, and a complementary control input for receiving said clock signal.

7. The microprocessor of claim 6 wherein said multiplexer comprises:

a first inverter having an input coupled to said output of said slave latch, an output forming said output of said multiplexer, a true control input for receiving a complement of said clock signal, and a complementary control input for receiving said clock signal; and a second inverter having an input coupled to said output of said master latch, an output coupled said output of said first inverter, a true control input for receiving said clock signal, and a complementary control input for receiving said complement of said clock signal.

8. The microprocessor of claim 4 wherein said multiplexer comprises:

a first inverter having an input coupled to said output of said slave latch, an output forming said output of said multiplexer, a true control input for receiving a complement of said clock signal, and a complementary control input for receiving said clock signal; and a second inverter having an input coupled to said output of said master latch, an output coupled said output of said first inverter, a true control input for receiving said clock signal, and a complementary control input for receiving said complement of said clock signal.

9. The microprocessor of claim 4 wherein each of said master latch and said slave latch comprises:

a first inverter having an input for receiving said data input signal, and an output for providing said output of a corresponding one of said master latch and said slave latch;

a second inverter having an input coupled to said output of said first inverter, and an output; and a third inverter having an input coupled to said output of said second inverter, an output coupled to said input of said second inverter.

10. The microprocessor of claim 9 further comprising:

an output inverter having an input coupled to said output of said slave latch, and an output, wherein said multiplexer comprises:

a first inverter having an input coupled to said output of said output inverter, an output forming said output of said multiplexer, a true control input for receiving a complement of said clock signal, and a complementary control input for receiving said clock signal; and a second inverter having an input coupled to said output of said master latch, an output coupled said output of said first inverter, a true control input for receiving said clock signal, and a complementary control input for receiving said complement of said clock signal.

11. The microprocessor of claim 4 further comprising:

an output inverter having an input coupled to said output of said slave latch, and an output, wherein said multiplexer comprises:

a first inverter having an input coupled to said output of said output inverter, an output forming said output of said multiplexer, a true control input for receiving a complement of said clock signal, and a complementary control input for receiving said clock signal; and a second inverter having an input coupled to said output of said master latch, an output coupled said output of said first inverter, a true control input for receiving said clock signal, and a complementary control input for receiving said complement of said clock signal.

* * * * *